US 9,032,357 B1

(12) United States Patent
Robles et al.

(10) Patent No.: US 9,032,357 B1
(45) Date of Patent: May 12, 2015

(54) GENERATING GUIDING PATTERNS FOR DIRECTED SELF-ASSEMBLY

(71) Applicant: Mentor Graphics Corporation, Wilsonville, OR (US)

(72) Inventors: Juan Andres Torres Robles, Wilsonville, OR (US); Yuri Granik, Palo Alto, CA (US); Kyohei Sakajiri, Portland, OR (US)

(73) Assignee: Mentor Graphics Corporation, Wilsonville, OR (US)

( * ) Notice: Subject to any disclaimer, the term of this patent is extended or adjusted under 35 U.S.C. 154(b) by 0 days.

(21) Appl. No.: 14/083,050

(22) Filed: Nov. 18, 2013

(51) Int. Cl.
  *G06F 17/50* (2006.01)
  *G06F 11/22* (2006.01)
(52) U.S. Cl.
  CPC ........ *G06F 17/5072* (2013.01); *G06F 17/5081* (2013.01)
(58) Field of Classification Search
  USPC .......................................................... 716/136
  See application file for complete search history.

(56) References Cited

U.S. PATENT DOCUMENTS

| 2011/0209106 | A1* | 8/2011 | Cheng et al. | 716/55 |
| 2012/0331428 | A1* | 12/2012 | Cheng et al. | 716/52 |
| 2013/0244439 | A1* | 9/2013 | Ghariehali et al. | 438/703 |
| 2014/0038318 | A1* | 1/2014 | Endo | 438/14 |

OTHER PUBLICATIONS

F.M. Schellenberg, J.A.R. Torres Using Phase Mask Algorithms to Direct Self Assembly Proc. of SPIE vol. 6151, 13 pages.
Chi-Chun Liu. et al. "Progress towards the integration of optical proximity correction and directed self-assembly of block copolymers with graphoepitaxy" Alternative Lithographic Technologies IV, edited by William M. Tong, Douglas J. Resnick, Proc. of SPIE, vol. 8323, 2012.
Kafai Lai, et. al, Computational Aspects of Optical Lithography Extension by Directed Self-Assembly Optical Microlithography XXVI, edited by Will Conley, Proc. of SPIE vol. 8683.

(Continued)

*Primary Examiner* — Suresh Memula

(57) ABSTRACT

Aspects of the invention relate to techniques of generating guiding patterns for via-type feature groups. A guiding pattern may be constructed for a via-type feature group that comprises two or more via-type features in a layout design. A backbone structure may then be determined for the guiding pattern. Based on the backbone structure and a self-assembly model, simulated locations of the two or more via-type features are computed. The simulated locations are compared with targeted locations. If the simulated locations do not match the targeted locations based on a predetermined criterion, the simulated locations adjusted to derive modified locations. Using the modified locations, the above operations may be repeated until the simulated locations match the targeted location based on a predetermined criterion or for a predetermined number of times.

20 Claims, 12 Drawing Sheets

Flow chart 800

(56) References Cited

OTHER PUBLICATIONS

Azat Latypov Computational solution of inverse directed self-assembly problem Alternative Lithographic Technologies V, edited by William M. Tong, Douglas J. Resnick, Proc. of SPIE vol. 8680, 2013 SPIE.

Azat Latypov, Moshe Preilb, Gerard Schmidc, Ji Xuc, He Yia, Kenji Yoshimotoc,d, Yi Zoua Exploration of the directed self-assembly based nano-fabrication design space using computational simulations Alternative Lithographic Technologies V, edited by William M. Tong, Douglas J. Resnick, Proc. of SPIE vol. 8680, 2013 SPIE.

William Hinsberg, Joy Cheng, Ho-Cheol Kim and Daniel P. Sanders Self-Assembling Materials for Lithographic Patterning: Overview, Status and Moving Forward Alternative Lithographic Technologies II, edited by Daniel J. C. Herr, Proc. of SPIE vol. 7637, 2010 SPIE.

* cited by examiner

GENERATING GUIDING PATTERNS FOR DIRECTED SELF-ASSEMBLY

FIELD OF THE INVENTION

The present invention relates to photolithographic processing technologies. Various implementations of the invention may be particularly useful for directed self-assembly lithographic patterning.

BACKGROUND OF THE INVENTION

Conventional lithographic imaging processes employ liquid immersion to increase the effective numerical aperture (NA) and make use of extensive resolution enhancement techniques (RET). This appears adequate to meet the lithographic needs of integrated circuits through the 32 nm generation. Starting from the 22 nm node, the numerical aperture NA has only marginally increased and the $k_1$ value is approaching the theoretical limit of 0.25. Further lithography scaling has been relied mainly on double or even multiple patterning techniques. While multiple patterning techniques provide the resolution required for further scaling, the overall cost to implement multiple patterning techniques has reached a level that other techniques may need to be explored.

Directed self-assembly (DSA) has recently emerged as such a technique for lithographic patterning to reach 22 nm and below. In self-assembly, the formation of features of fine geometric dimensions actually occurs not through external patterning, but through the spontaneous phase behavior found among polymers on the molecular level. Of particular interest are diblock copolymers formed by chemically connecting normally incompatible species, such as poly(styrene) (PS) and poly(methyl-methacrylate) (PMMA). By creating linked chains of these materials and controlling the relative molecular weight, various structures can spontaneously form. The appeal of these structures, easily formed around 20 nm in size, is that the boundaries between the two disparate polymers can be quite uniform, with the uniformity dictated not by the noise properties of a patterning process, but by the relative molecular weight of the polymers. This is a quantity that can be very precisely controlled.

One problem with these polymers is that, although local order and roughness can be quite good, small variations in the polymer chain can lead to kinks that reset the self-assembly process. Long range patterns therefore appear somewhat chaotic. The problem of long range order can be addressed by using a conventional patterning process to guide and direct the spontaneous formation of the block co-polymer structures. This "directed self-assembly" can take the form of having the self-assembly occur in grooves or other geometrically confined regions or by chemically patterning a surface to create local affinities to the various portions of the block co-polymers.

A lot of progress of DSA in getting impressive resolution has been repeatedly demonstrated using the PS-PMMA system. Some record low pitches of sub-15 nm have been observed in laboratory recently. DSA also has an advantage of not requiring new capital equipment investment and can be used complimentary with other lithographic techniques, including EUV and Direct Write Electron Beam (Ebeam). A reduction in total mask count is made possible by using DSA with optical lithography. However, DSA has its own set of challenges that need to be addressed before becoming a viable alternative to current lithographic techniques.

BRIEF SUMMARY OF THE INVENTION

Aspects of the invention relate to techniques of generating guiding patterns for via-type feature groups. Information of a via-type feature group is first received. The via-type feature group comprises two or more via-type features in a layout design. The information of the via-type feature group comprises targeted locations of the two or more via-type features. The two or more via-type features may be grouped together based on at least distances between neighboring via-type features of the two or more via-type features. The via-type feature group may be DSA-compliant, determined, for example, based on distorted areas.

Based on the targeted locations of the two or more via-type features, a guiding pattern may be constructed for the via-type feature group. The constructing may further be based on area ratio information of a di-block copolymer.

A backbone structure may then be determined for the guiding pattern. The backbone structure is a line structure that runs through centers of the via-type features. The guiding pattern may be mapped with back-bone coordinates.

Based on the backbone structure and a self-assembly model, simulated locations of the two or more via-type features are computed. One self-assembly model that can be employed by various embodiments of the invention is based on elastic potential energy (Hooke's law). The simulated locations may be derived by minimizing the potential energy of the di-block copolymer within the guiding pattern.

The simulated locations are compared with the target locations. If the simulated locations do not match the targeted locations based on a predetermined criterion, the simulated locations adjusted to derive modified locations. Using the modified locations, the above operations may be repeated until the simulated locations match the targeted location based on a predetermined criterion or for a predetermined number of times.

DETAILED DESCRIPTION OF THE INVENTION

Figure 1:
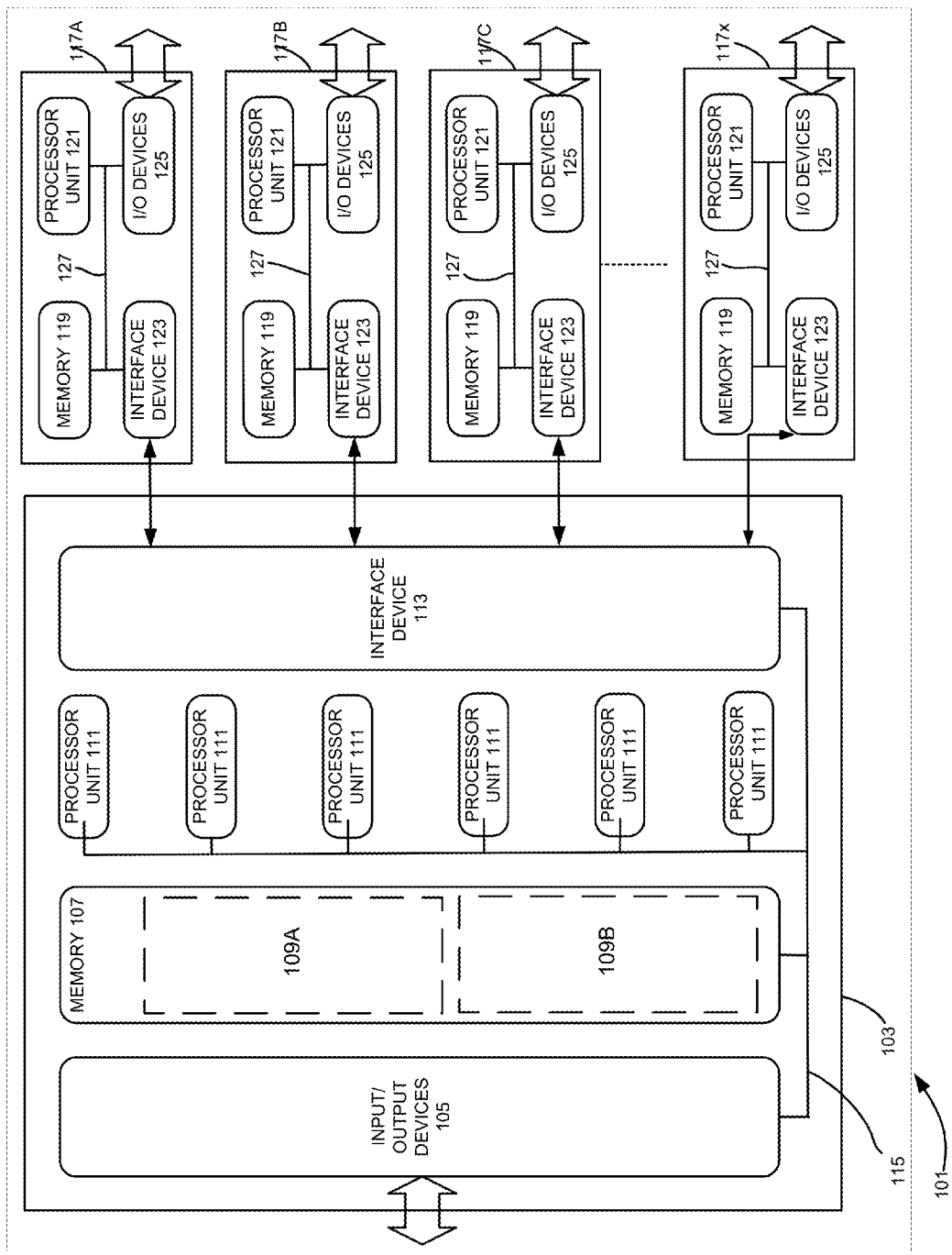
FIG. 1 illustrates an example of a computing system that may be used to implement various embodiments of the invention.

Various aspects of the present invention relate to techniques of generating guiding patterns for via-type feature groups. In the following description, numerous details are set forth for purpose of explanation. However, one of ordinary skill in the art will realize that the invention may be practiced without the use of these specific details. In other instances, well-known features have not been described in detail to avoid obscuring the present invention.

Although the operations of some of the disclosed methods, apparatus, and systems are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods, apparatus, and systems can be used in conjunction with other methods, apparatus, and systems. Additionally, the description sometimes uses terms like "construct," "compute" and "determine" to describe the disclosed methods. These terms are high-level abstractions of the actual operations that are performed. The actual operations that correspond to these terms may vary depending on the particular implementation and are readily discernible by one of ordinary skill in the art.

Any of the disclosed techniques can be implemented in whole or in part by software comprising computer-executable instructions stored on computer-readable media. Such software can comprise, for example, an appropriate electronic design automation ("EDA") software tool (e.g., an automatic test pattern generation ("ATPG") tool). Such software can be executed on a single computer or on a networked computer (e.g., via the Internet, a wide-area network, a local-area network, a client-server network, or other such network). For clarity, only certain selected aspects of the software-based implementations are described. Other details that are well known in the art are omitted. For example, it should be understood that the disclosed technology is not limited to any specific computer language, program, or computer. For example, the disclosed technology can be implemented using any commercially available computer executing a program written in any commercially available or otherwise suitable language. Any of the disclosed methods can alternatively be implemented (partially or completely) in hardware (e.g., an ASIC, PLD, or SoC).

Any data produced from any of the disclosed methods (e.g., intermediate or final test patterns, test patterns values, or control data) can be stored on computer-readable media (e.g., tangible computer-readable media, such as one or more CDs, volatile memory components (such as DRAM or SRAM), or nonvolatile memory components (such as hard drives)) using a variety of different data structures or formats. Such data can be created, updated, or stored using a local computer or over a network (e.g., by a server computer).

As used in this disclosure, the singular forms "a," "an," and "the" include the plural forms unless the context clearly dictates otherwise. Additionally, the term "includes" means "comprises." Moreover, unless the context dictates otherwise, the term "coupled" means electrically or electromagnetically connected or linked, and includes both direct connections or direct links and indirect connections or indirect links through one or more intermediate elements not affecting the intended operation of the circuit.

Furthermore, the term "design" is intended to encompass data describing an entire microdevice, such as an integrated circuit device or micro-electromechanical system (MEMS) device. This term also is intended to encompass a smaller group of data describing one or more components of an entire microdevice, however, such as a layer of an integrated circuit device, or even a portion of a layer of an integrated circuit device.

Still further, the term "design" also is intended to encompass data describing more than one microdevice, such as data to be used to create a mask or reticle for simultaneously forming multiple microdevices on a single wafer. The layout design data may be in any desired format, such as, for example, the Graphic Data System II (GDSII) data format or the Open Artwork System Interchange Standard (OASIS) data format proposed by Semiconductor Equipment and Materials International (SEMI). Other formats include an open source format named Open Access, Milkyway by Synopsys, Inc., and EDDM by Mentor Graphics, Inc.

Illustrative Operating Environment

The execution of various electronic design automation processes according to embodiments of the invention may be implemented using computer-executable software instructions executed by one or more programmable computing devices. Because these embodiments of the invention may be implemented using software instructions, the components and operation of a generic programmable computer system on which various embodiments of the invention may be employed will first be described. Further, because of the complexity of some electronic design automation processes and the large size of many circuit designs, various electronic design automation tools are configured to operate on a computing system capable of simultaneously running multiple processing threads. The components and operation of a computer network having a host or master computer and one or more remote or servant computers therefore will be described with reference to FIG. 1. This operating environment is only one example of a suitable operating environment, however, and is not intended to suggest any limitation as to the scope of use or functionality of the invention.

In FIG. 1, the computer network 101 includes a master computer 103. In the illustrated example, the master computer 103 is a multi-processor computer that includes a plurality of input and output devices 105 and a memory 107. The input and output devices 105 may include any device for receiving input data from or providing output data to a user. The input devices may include, for example, a keyboard, microphone, scanner or pointing device for receiving input from a user. The output devices may then include a display monitor, speaker, printer or tactile feedback device. These devices and their connections are well known in the art, and thus will not be discussed at length here.

The memory 107 may similarly be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information.

As will be discussed in detail below, the master computer 103 runs a software application for performing one or more operations according to various examples of the invention. Accordingly, the memory 107 stores software instructions 109A that, when executed, will implement a software application for performing one or more operations. The memory 107 also stores data 109B to be used with the software application. In the illustrated embodiment, the data 109B contains process data that the software application uses to perform the operations, at least some of which may be parallel.

The master computer 103 also includes a plurality of processor units 111 and an interface device 113. The processor units 111 may be any type of processor device that can be programmed to execute the software instructions 109A, but will conventionally be a microprocessor device. For example, one or more of the processor units 111 may be a commercially generic programmable microprocessor, such as Intel® Pentium® or Xeon™ microprocessors, Advanced Micro Devices Athlon™ microprocessors or Motorola 68K/Coldfire® microprocessors. Alternately or additionally, one or more of the processor units 111 may be a custom-manufactured processor, such as a microprocessor designed to optimally perform specific types of mathematical operations. The interface device 113, the processor units 111, the memory 107 and the input/output devices 105 are connected together by a bus 115.

Figure 2:
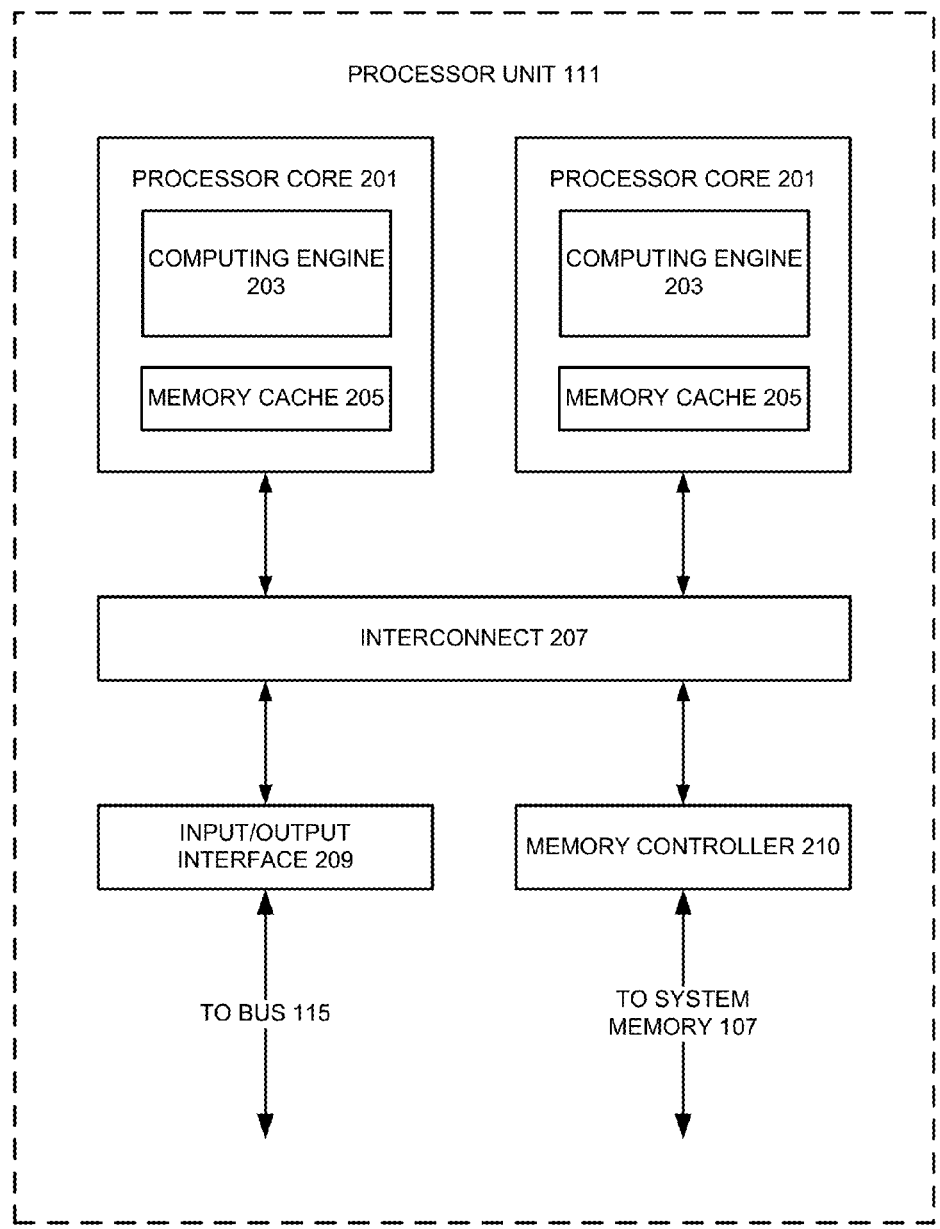
FIG. 2 illustrates an example of a multi-core processor unit that may be used to implement various embodiments of the invention.

With some implementations of the invention, the master computing device 103 may employ one or more processing units 111 having more than one processor core. Accordingly, FIG. 2 illustrates an example of a multi-core processor unit 111 that may be employed with various embodiments of the invention. As seen in this figure, the processor unit 111 includes a plurality of processor cores 201. Each processor core 201 includes a computing engine 203 and a memory cache 205. As known to those of ordinary skill in the art, a computing engine contains logic devices for performing various computing functions, such as fetching software instructions and then performing the actions specified in the fetched instructions. These actions may include, for example, adding, subtracting, multiplying, and comparing numbers, performing logical operations such as AND, OR, NOR and XOR, and retrieving data. Each computing engine 203 may then use its corresponding memory cache 205 to quickly store and retrieve data and/or instructions for execution.

Each processor core 201 is connected to an interconnect 207. The particular construction of the interconnect 207 may vary depending upon the architecture of the processor unit 111. With some processor cores 201, such as the Cell microprocessor created by Sony Corporation, Toshiba Corporation and IBM Corporation, the interconnect 207 may be implemented as an interconnect bus. With other processor units 111, however, such as the Opteron™ and Athlon™ dual-core processors available from Advanced Micro Devices of Sunnyvale, Calif., the interconnect 207 may be implemented as a system request interface device. In any case, the processor cores 201 communicate through the interconnect 207 with an input/output interface 209 and a memory controller 210. The input/output interface 209 provides a communication interface between the processor unit 111 and the bus 115. Similarly, the memory controller 210 controls the exchange of information between the processor unit 111 and the system memory 107. With some implementations of the invention, the processor units 111 may include additional components, such as a high-level cache memory accessible shared by the processor cores 201.

While FIG. 2 shows one illustration of a processor unit 111 that may be employed by some embodiments of the invention, it should be appreciated that this illustration is representative only, and is not intended to be limiting. Also, with some implementations, a multi-core processor unit 111 can be used in lieu of multiple, separate processor units 111. For example, rather than employing six separate processor units 111, an alternate implementation of the invention may employ a single processor unit 111 having six cores, two multi-core processor units each having three cores, a multi-core processor unit 111 with four cores together with two separate single-core processor units 111, etc.

Returning now to FIG. 1, the interface device 113 allows the master computer 103 to communicate with the servant computers 117A, 117B, 117C . . . 117x through a communication interface. The communication interface may be any suitable type of interface including, for example, a conventional wired network connection or an optically transmissive wired network connection. The communication interface may also be a wireless connection, such as a wireless optical connection, a radio frequency connection, an infrared connection, or even an acoustic connection. The interface device 113 translates data and control signals from the master computer 103 and each of the servant computers 117 into network messages according to one or more communication protocols, such as the transmission control protocol (TCP), the user datagram protocol (UDP), and the Internet protocol (IP). These and other conventional communication protocols are well known in the art, and thus will not be discussed here in more detail.

Each servant computer 117 may include a memory 119, a processor unit 121, an interface device 123, and, optionally, one more input/output devices 125 connected together by a system bus 127. As with the master computer 103, the optional input/output devices 125 for the servant computers 117 may include any conventional input or output devices, such as keyboards, pointing devices, microphones, display monitors, speakers, and printers. Similarly, the processor units 121 may be any type of conventional or custom-manufactured programmable processor device. For example, one or more of the processor units 121 may be commercially generic programmable microprocessors, such as Intel® Pentium® or Xeon™ microprocessors, Advanced Micro Devices Athlon™ microprocessors or Motorola 68K/Coldfire® microprocessors. Alternately, one or more of the processor units 121 may be custom-manufactured processors, such as microprocessors designed to optimally perform specific types of mathematical operations. Still further, one or more of the processor units 121 may have more than one core, as described with reference to FIG. 2 above. For example, with some implementations of the invention, one or more of the processor units 121 may be a Cell processor. The memory 119 then may be implemented using any combination of the computer readable media discussed above. Like the interface device 113, the interface devices 123 allow the servant computers 117 to communicate with the master computer 103 over the communication interface.

In the illustrated example, the master computer 103 is a multi-processor unit computer with multiple processor units 111, while each servant computer 117 has a single processor unit 121. It should be noted, however, that alternate implementations of the invention may employ a master computer having single processor unit 111. Further, one or more of the servant computers 117 may have multiple processor units 121, depending upon their intended use, as previously discussed. Also, while only a single interface device 113 or 123 is illustrated for both the master computer 103 and the servant computers, it should be noted that, with alternate embodiments of the invention, either the computer 103, one or more of the servant computers 117, or some combination of both may use two or more different interface devices 113 or 123 for communicating over multiple communication interfaces.

With various examples of the invention, the master computer 103 may be connected to one or more external data storage devices. These external data storage devices may be implemented using any combination of computer readable media that can be accessed by the master computer 103. The computer readable media may include, for example, microcircuit memory devices such as read-write memory (RAM), read-only memory (ROM), electronically erasable and programmable read-only memory (EEPROM) or flash memory microcircuit devices, CD-ROM disks, digital video disks (DVD), or other optical storage devices. The computer readable media may also include magnetic cassettes, magnetic tapes, magnetic disks or other magnetic storage devices, punched media, holographic storage devices, or any other medium that can be used to store desired information. According to some implementations of the invention, one or more of the servant computers 117 may alternately or additionally be connected to one or more external data storage devices. Typically, these external data storage devices will include data storage devices that also are connected to the master computer 103, but they also may be different from any data storage devices accessible by the master computer 103.

It also should be appreciated that the description of the computer network illustrated in FIG. 1 and FIG. 2 is provided as an example only, and it not intended to suggest any limitation as to the scope of use or functionality of alternate embodiments of the invention.

DSA-Compliant Feature Groups and Guiding Patterns

As noted briefly in Background Of Invention, self-assembly (DSA) may be directed or guided in two ways: graphoepitaxy and chemo-epitaxy. In a grapho-epitaxy process, topographical features such as photoresist or hard mask are used to guide the phase segregation. In a chemo-epitaxy process, a thin underlying pining layer is used to pin the phase segregation process. All process steps can be run inside a standard lithography track and etch tool. Directed self-assembly patterning processes may also be categorized into two groups according to targeted lithographic patterns: one for line-type features and the other for via-type features. The line-type features may be patterned with chemo-epitaxy or grapho-epitaxy while the vis-type features are usually patterned with grapho-epitaxy.

Figure 3:
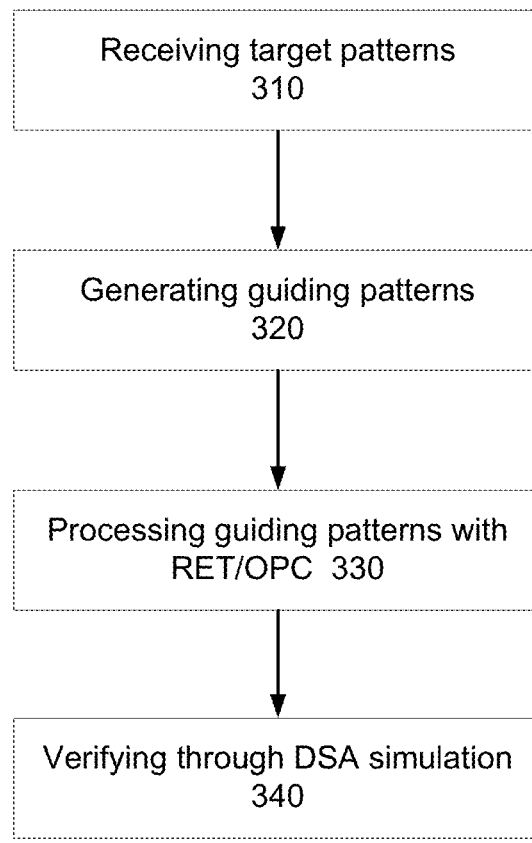
FIG. 3 illustrates a flow for DSA-based lithographic patterning (prior art).

FIG. 3 illustrates a flow for DSA-based lithographic patterning. In operation 310, target patterns are received. A target pattern is a feature desired to be "printed" on a chip. In operation 320, guiding patterns are generated for the target patterns. A guiding pattern is a pattern for directing or guiding self-assembly of certain materials e.g., block copolymers. The pattern formed by the directed self-assembly process resembles the target pattern. In a grapho-epitaxy process employing the PS-PMMA system, for example, self-assembled PMMA patterns correspond to target patterns. Due to their small sizes and optical diffractive effects, the guiding patterns associated with the target patterns are processed in operation 330 with one or more resolution enhancement techniques (RETs) such as optical proximity correction (OPC). After the guiding patterns are processed, in operation 330, DSA simulation is performed to verify that the guiding patterns can be used to form patterns close to the target patterns.

As with any other processes, directed self-assembly may generate patterns with defects. A DSA-specific defect is defined by the occurrence of an undesired morphology of the phase separation or the loss of ordering of the structure. The formation of DSA-specific defects is mainly about free energy minimization and governed by thermodynamic principles. Accordingly, generating appropriate guiding patterns is important for reducing/eliminating DSA-specific defects. For some target patterns, however, it may be too difficult if not impossible to generate appropriate guiding patterns. These target patterns are referred to as non-DSA-compliant features. Identifying and removing non-DSA-compliant features (or DSA-compliant features) can help the guiding pattern generation.

DSA-Compliant Feature Grouping Tool and Methods

Figure 4:
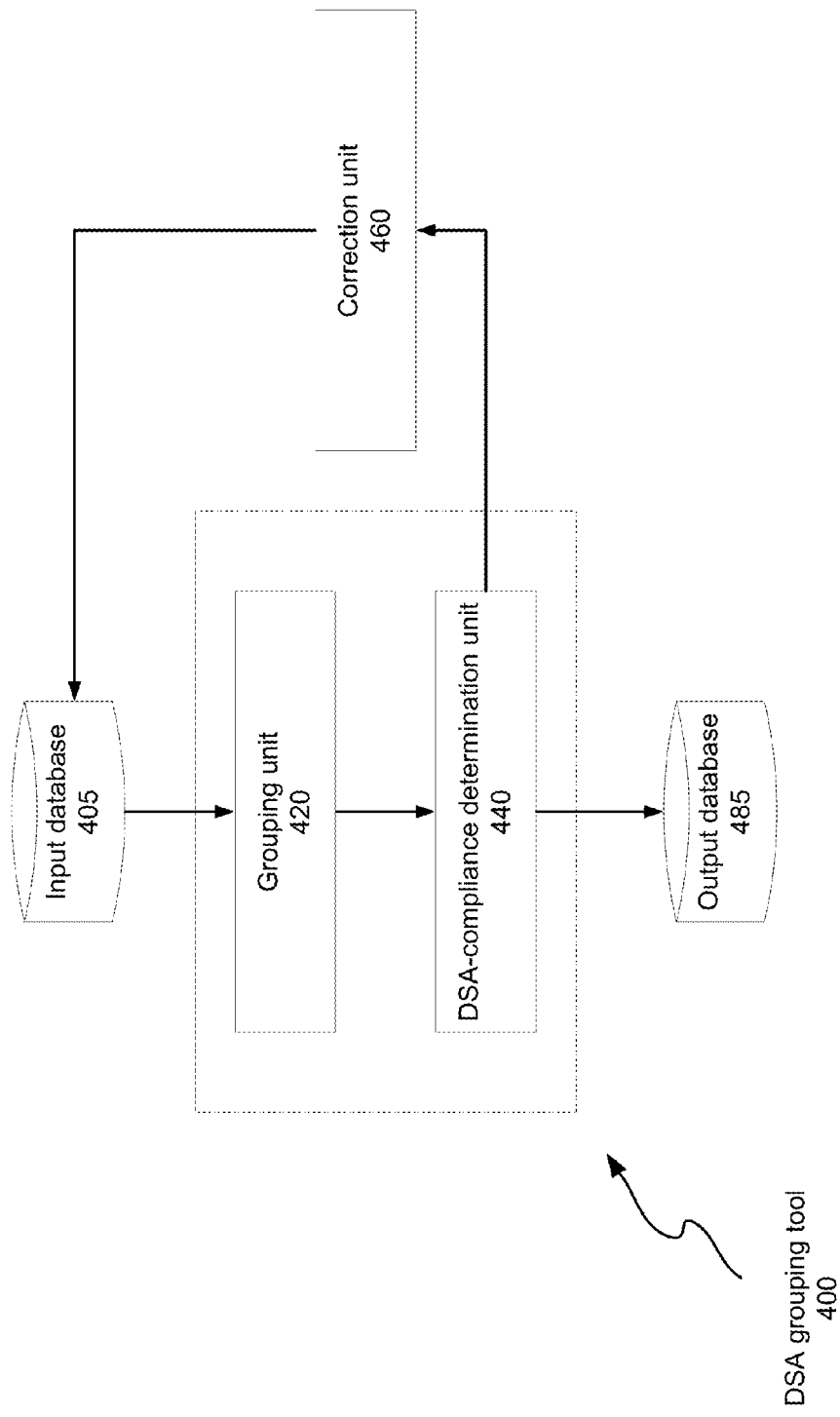
FIG. 4 illustrates an example of a DSA-compliant feature grouping tool that may be implemented according to various embodiments of the invention.

FIG. 4 illustrates an example of a DSA-compliant feature grouping tool 400 that may be implemented according to various embodiments of the invention. As seen in this figure, the DSA-compliant feature grouping tool 400 includes a grouping unit 420 and a DSA-compliance determination unit 440. As will be discussed in more detail below, the grouping unit 420 separates via-type features in a layout design into via-type feature groups and isolated via-type features, and the DSA-compliance determination unit 440 analyzes the via-type feature groups to determine whether the via-type feature groups are DSA-compliant.

As will also be discussed in more detail below, some implementations of the DSA-compliant feature grouping tool 400 may cooperate with (or incorporate) one or more of a correction unit 460, an input database 405 and an output database 485. While the input database 405 and the output database 485 are shown as separate units in FIG. 4, a single data storage medium may be used to implement some or both of these databases.

According to some embodiments of the invention, one or more of the grouping unit 420, the DSA-compliance determination unit 440 and the correction unit 460 are implemented by one or more computing systems, such as the computing system illustrated in FIGS. 1 and 2, executing programmable instructions. Correspondingly, some other embodiments of the invention may be implemented by software-executable instructions, stored on a non-transitory computer-readable medium, for instructing a computing system to perform functions of one or more of the grouping unit 420, the DSA-compliance determination unit 440 and the correction unit 460. As used herein, the term "non-transitory computer-readable medium" refers to computer-readable medium that are capable of storing data for future retrieval, and not for propagating electro-magnetic waves. The non-transitory computer-readable medium may be, for example, a magnetic storage device, an optical storage device, a "punched" surface type device, or a solid state storage device.

Figure 5:
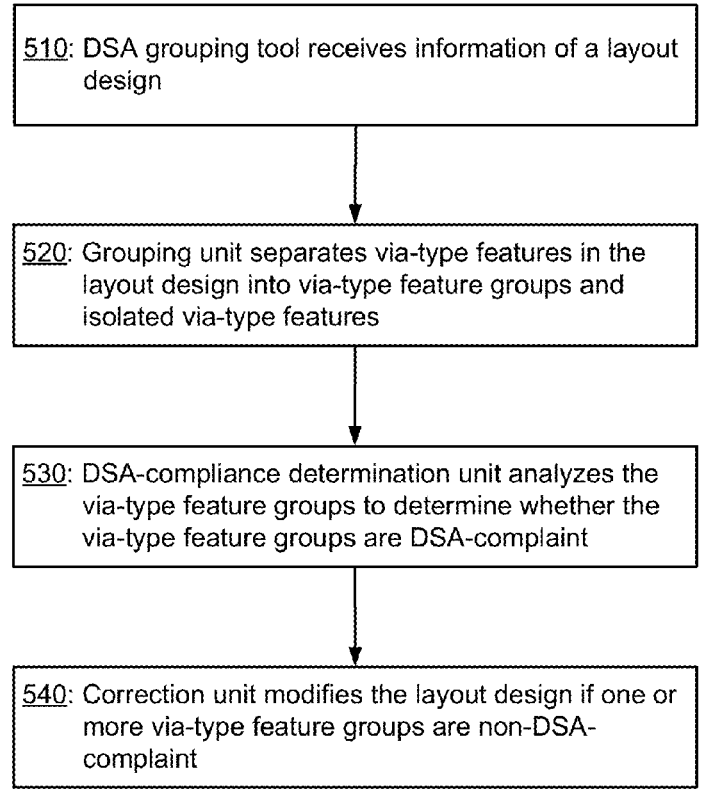
FIG. 5 illustrates an example of a flow chart describing a method for grouping DSA-compliant features that may be employed according to various embodiments of the invention.

For ease of understanding, methods for grouping DSA-compliant features that may be employed according to various embodiments of the invention will be described with reference to the DSA-compliant feature grouping tool 400 in FIG. 4 and the flow chart 500 illustrated in FIG. 5. It should be appreciated, however, that alternate implementations of a DSA-compliant feature grouping tool may be used to perform the methods for grouping DSA-compliant features illustrated by the flow chart 500 according to various embodiments of the invention. Likewise, the DSA-compliant feature grouping tool 400 may be employed to perform other methods for grouping DSA-compliant features according to various embodiments of the invention.

Initially, in operation 510 of the flowchart 500, the DSA-compliant feature grouping tool 400 receives information of a layout design. A layout design is a physical design that describes specific geometric elements. The geometric elements, which typically are polygons, define the shapes that will be created in various layers of material to manufacture the circuit. The layout design may encompass data describing an entire integrated circuit device, a smaller group of data describing one or more components of an entire device such as a portion of an integrated circuit device, or data describing more than one device, such as data to be used to form multiple devices on a single wafer.

Next, in operation 520, the grouping unit 420 separates via-type features in the layout design into via-type feature groups and isolated via-type features. Whether a via-type feature is an isolated via-type feature or belongs to a via-type feature group may depend at least on distance between the via-type feature and via-type features neighboring the via-type feature. The distance may be center-to-center distance. A predefined threshold value may be used for the grouping operation. If two via-type features are separated by a distance smaller than the predefined threshold value, they may be grouped together by the grouping unit 420. A via-type feature group may include more than two vie-type features.

Next, in operation 530, the DSA-compliance determination unit 440 analyzes the via-type feature groups to determine whether the via-type feature groups are DSA-compliant. An isolated via-type feature is typically DSA-compliant. This may not be the case for a via-type feature group. To determine DSA-compliance of a via-type feature group, according to some embodiments of the invention, the DSA-compliance determination unit 440 determines distances between neighboring via-type features in the via-type feature group and compares them with predetermined threshold value(s).

Figure 6A:
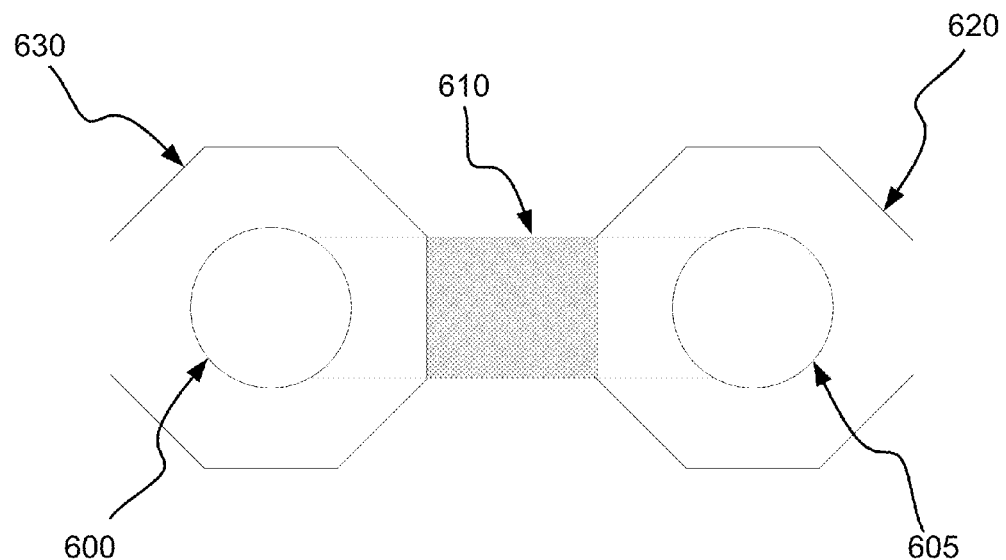
FIG. 6A illustrates an example of a distorted area of two via-type features which is not covered by the DSA shells of the two via-type features.
Figure 6B:
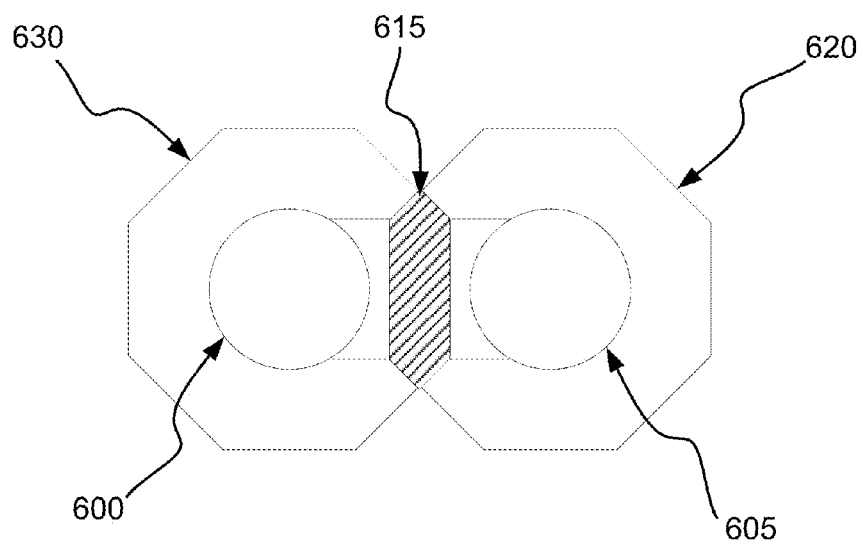
FIG. 6B illustrates an example of a distorted area of two via-type features which is covered by both of the DSA shells of the two via-type features.

In some other embodiments of the invention, the DSA-compliance determination unit 440 first determines distorted areas for neighboring via-type features in a via-type feature group. A distorted area for two neighboring via-type features may be an area covered by neither of or both of DSA shells of the two neighboring via-type features. The contour of the DSA shell for a via-type feature may be the contour of an estimated guiding pattern for the via-type feature being isolated or a geometric shape larger than the via-type feature. FIGS. 6A and 6B illustrates two examples of distorted areas of a via-type feature group including two neighboring via-type features. In the figures, target patterns of the two via-type features have contours 600 and 605 and the corresponding DSA shells have contours 630 and 620. The distorted area 610 in FIG. 6A is an area not covered by either of the two DSA shells while the distorted area 615 in FIG. 6B is an area covered by both of the two DSA shells.

By comparing the determined distorted areas with predetermined threshold value(s), the DSA-compliance determination unit 440 then accesses whether the via-type feature group is DSA-compliant. If a distorted area of a via-type feature group is greater than a predetermined threshold value, the via-type feature group may be designated as non-DSA-compliant. Distorted areas formed by overlapping of DSA shells and those by non-overlapping of DSA shells may use the same predetermined threshold value or different predetermined threshold values.

The DSA shells shown in FIGS. 6A and 6B have octagon shapes. As will be appreciated by those of ordinary skill in the art, different shapes may be employed by various embodiments of the invention.

In operation 540, the correction unit 460 modifies the layout design if one or more via-type feature groups are non-DSA-compliant. After the modification, the operations 530 or both of the operations 520 and 530 may be repeated.

Guiding Pattern Generation Tool and Methods

Figure 7:
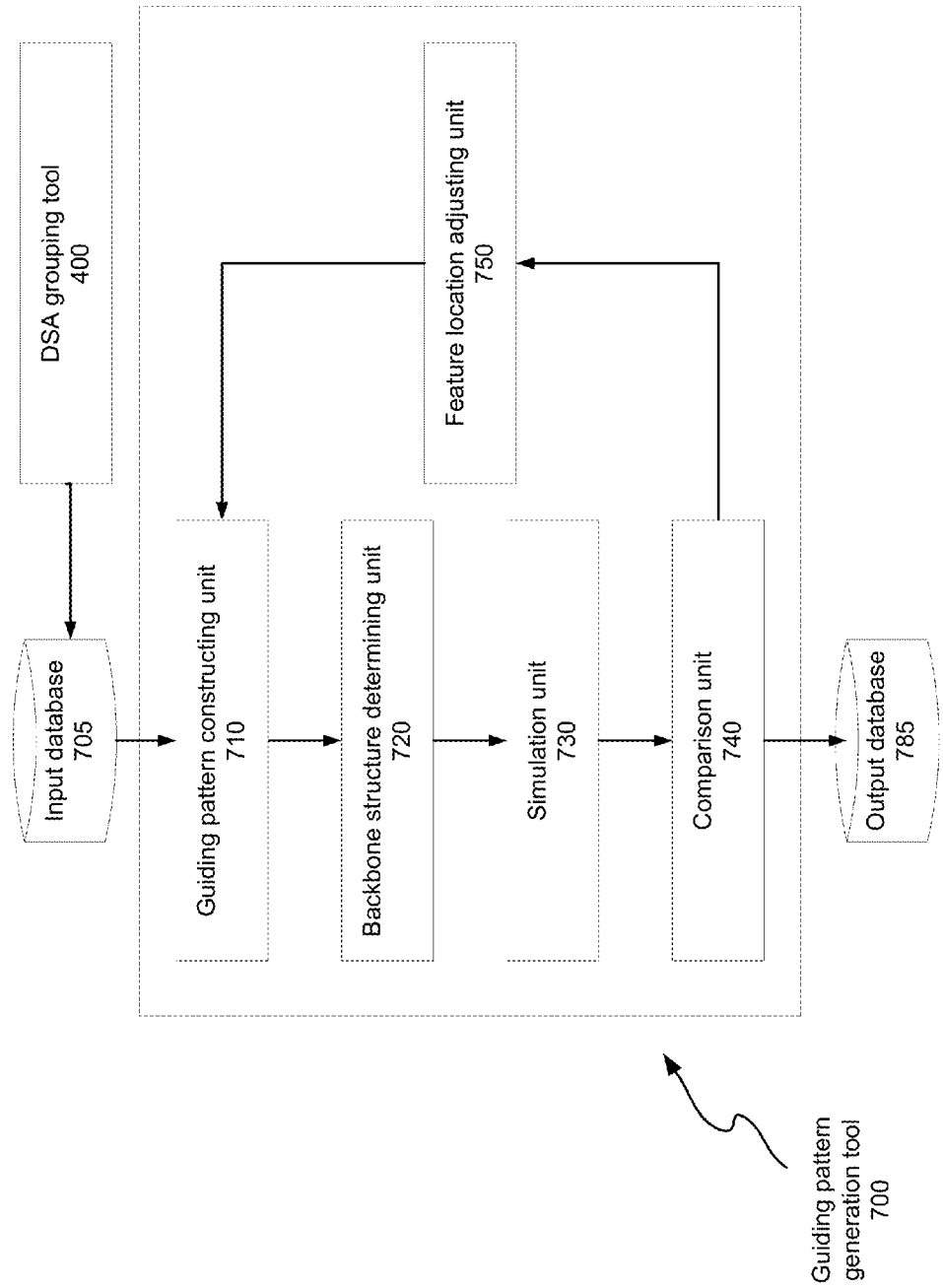
FIG. 7 illustrates an example of a guiding pattern generation tool 700 that may be implemented according to various embodiments of the invention.

FIG. 7 illustrates an example of a guiding pattern generation tool 700 that may be implemented according to various embodiments of the invention. As seen in this figure, the guiding pattern generation tool 700 includes a guiding pattern constructing unit 710, a backbone structure determining unit 720, a simulation unit 730, a comparison unit 740 and a feature location adjusting unit 750. As will be discussed in more detail below, the guiding pattern constructing unit 710 constructs a guiding pattern for a via-type feature group, the backbone structure determining unit 720 determines a backbone structure for the guiding pattern, the simulation unit 730 computes simulated locations of via-type features based on the backbone structure, the comparison unit 740 compares the simulated locations with corresponding targeted locations and the feature location adjusting unit 750 adjusts the simulated locations if the simulated locations do not match the targeted locations based on a predetermined criterion.

As will also be discussed in more detail below, some implementations of the guiding pattern generation tool 700 may cooperate with (or incorporate) one or more of the DSA-compliant feature grouping tool 400, an input database 705 and an output database 785. While the input database 705 and the output database 785 are shown as separate units in FIG. 7, a single data storage medium may be used to implement some or both of these databases.

According to some embodiments of the invention, one or more of the guiding pattern constructing unit 710, the backbone structure determining unit 720, the simulation unit 730, the comparison unit 740 and the feature location adjusting unit 750 are implemented by one or more computing systems, such as the computing system illustrated in FIGS. 1 and 2, executing programmable instructions. Correspondingly, some other embodiments of the invention may be implemented by software-executable instructions, stored on a non-transitory computer-readable medium, for instructing a computing system to perform functions of one or more of the guiding pattern constructing unit 710, the backbone structure determining unit 720, the simulation unit 730, the comparison unit 740 and the feature location adjusting unit 750. As used herein, the term "non-transitory computer-readable medium" refers to computer-readable medium that are capable of storing data for future retrieval, and not for propagating electromagnetic waves. The non-transitory computer-readable medium may be, for example, a magnetic storage device, an optical storage device, a "punched" surface type device, or a solid state storage device.

Figure 8:
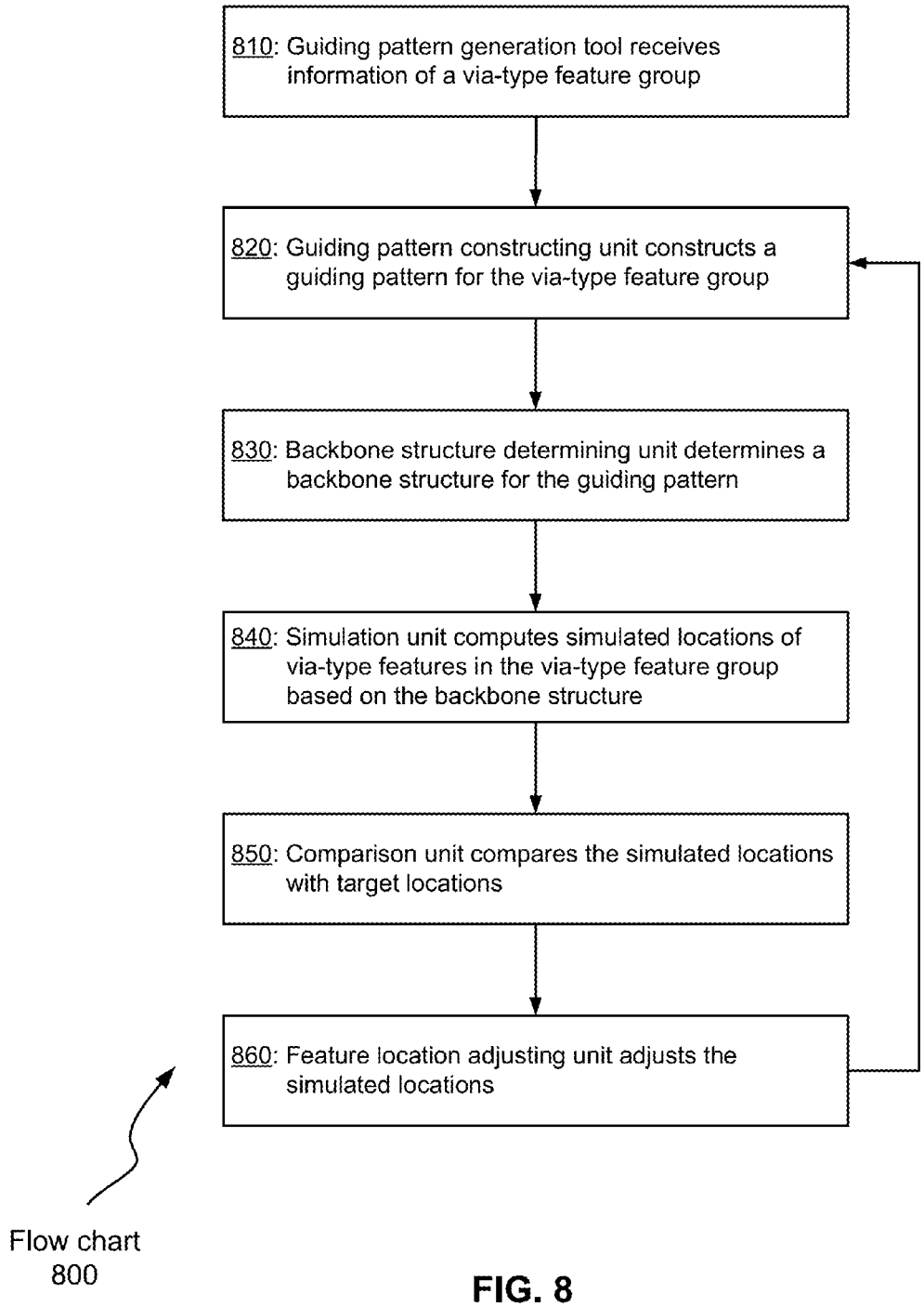
FIG. 8 illustrates an example of a flow chart describing methods of guiding pattern generation that may be employed according to various embodiments of the invention.

For ease of understanding, methods of guiding pattern generation that may be employed according to various embodiments of the invention will be described with reference to the guiding pattern generation tool 700 in FIG. 7 and the flow chart 800 illustrated in FIG. 8. It should be appreciated, however, that alternate implementations of a guiding pattern generation tool may be used to perform the methods of guiding pattern generation illustrated by the flow chart 800 according to various embodiments of the invention. Likewise, the guiding pattern generation tool 700 may be employed to perform other methods of guiding pattern generation according to various embodiments of the invention.

Initially, in operation 810 of the flowchart 800, the guiding pattern generation tool 700 receives information of a via-type feature group. The via-type feature group comprises two or more via-type features in a layout design. The information of the via-type feature group comprises targeted locations of the two or more via-type features. The two or more via-type features may be grouped together based on at least distances between neighboring via-type features of the two or more via-type features, similar to the operation 520 of the flow chart 500. The via-type feature group may be DSA-compliant, which may be determined based on, for example, distorted areas.

Figure 9:
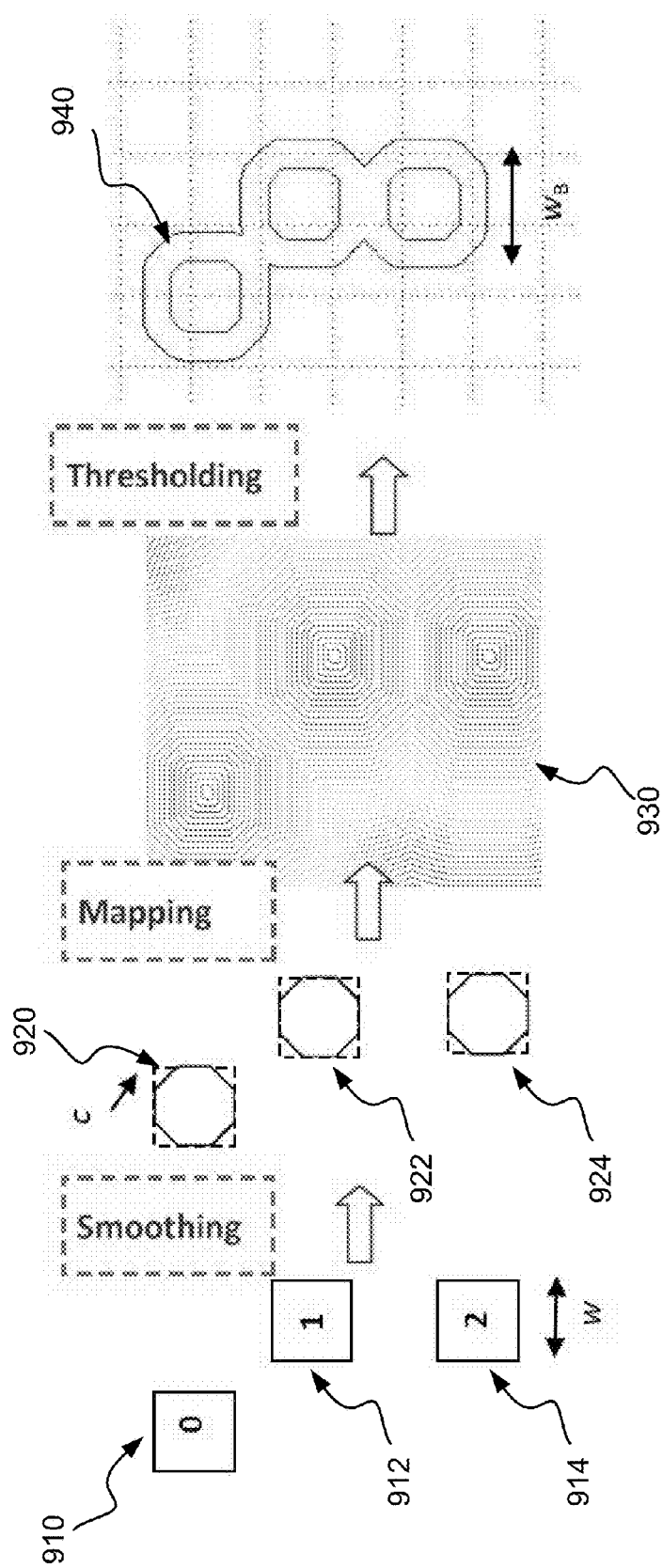
FIG. 9 illustrates an example of constructing a guiding pattern based on targeted locations of via-type features that may be implemented according to various embodiments of the invention.

Next, in operation 820, the guiding pattern constructing unit 710 constructs a guiding pattern for the via-type feature group based on the targeted locations of the two or more via-type features. FIG. 9 illustrates an example of constructing a guiding pattern that may be implemented according to various embodiments of the invention. Features 910, 912 and 914 indicate targeted locations of three via-type features. In this case, shapes of these via-type features are derived by changing the squares 910, 912 and 914 into octagons 920, 922 and 924, respectively. It should be appreciated that other shapes such as hexagons or targeted shapes if provided may also be used. In a DSA process using a di-block copolymer (AB), the octagons should be the shape formed by one polymer (A) in the di-block copolymer while the guiding pattern represents the shape of the other polymer (B).

To construct the guiding pattern, the octagons 920, 922 and 924 may be mapped with a distance map grid 930:

$$A: D(x,y)=0 \quad (1)$$

This contour is the contour for the polymer A, i.e., representing the boundary between the two polymers A and B. The polymer B is assumed to fill space around the polymer A such that the area ratio B/A=B/A=(1−f)/f. To compute the contour for the polymer B, an appropriate threshold T may first be found to deliver the area ratio:

$$(1-f)\int_{D(x,y)<0} dx\,dy = f\int_{0<D(x,y)<T} dx\,dy \quad (2)$$

The contour for B may then be expressed as:

$$B: D(x,y)=T(f) \quad (3)$$

The derived contour B 940 can be used as the contour for the guiding pattern.

Figure 10:
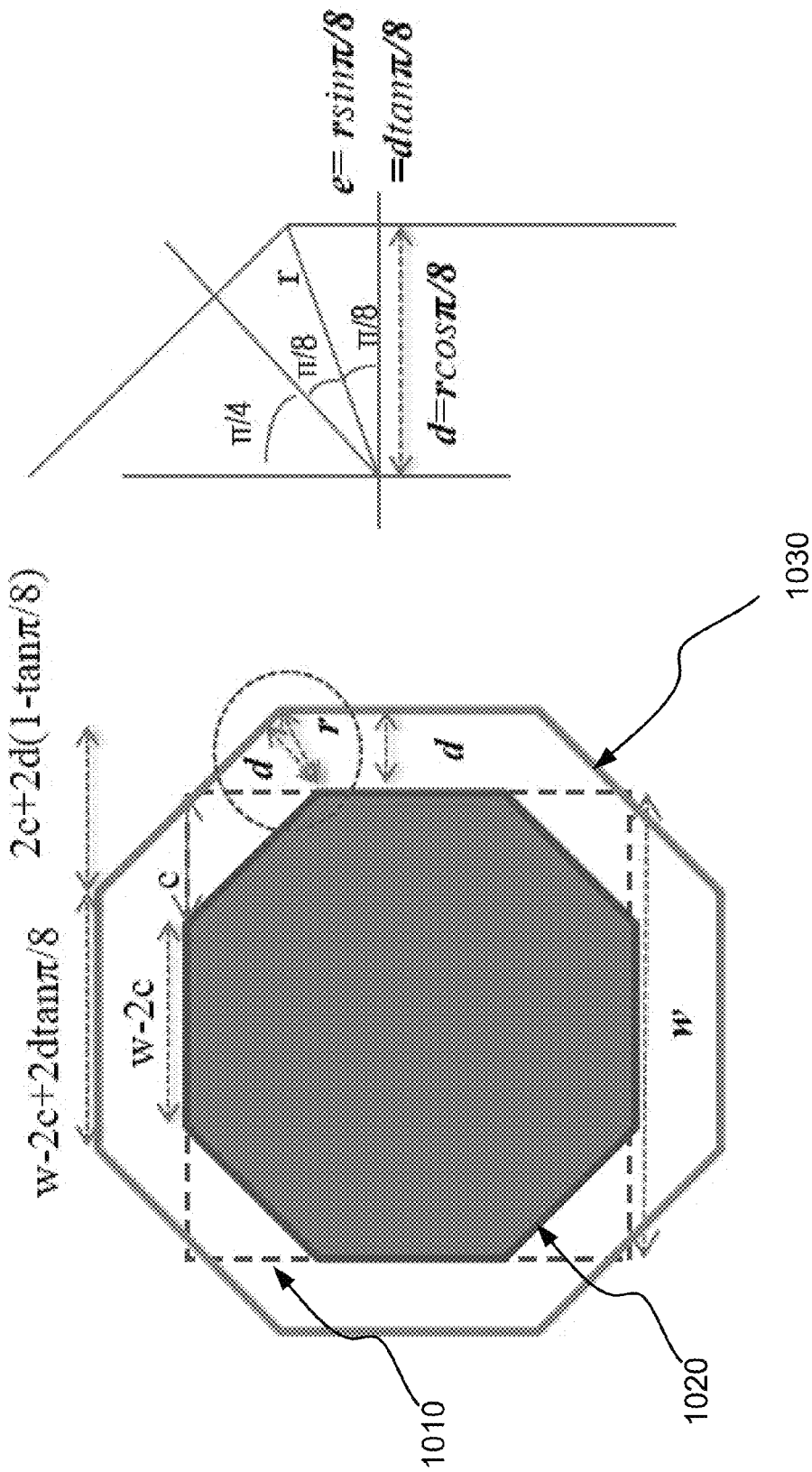
FIG. 10 another example of constructing a guiding pattern based on targeted locations of via-type features that may be implemented according to various embodiments of the invention.

FIG. 10 illustrates another example of constructing a guiding pattern that may be implemented according to various embodiments of the invention. Similar to the example in FIG. 9, the shape of a via-type feature 1010 may be represented by an octagon 1020. A biased value d is then calculated to achieve desired area ratio. Based on the biased value d, a contour 1030 for the guiding pattern is constructed.

Figure 11:
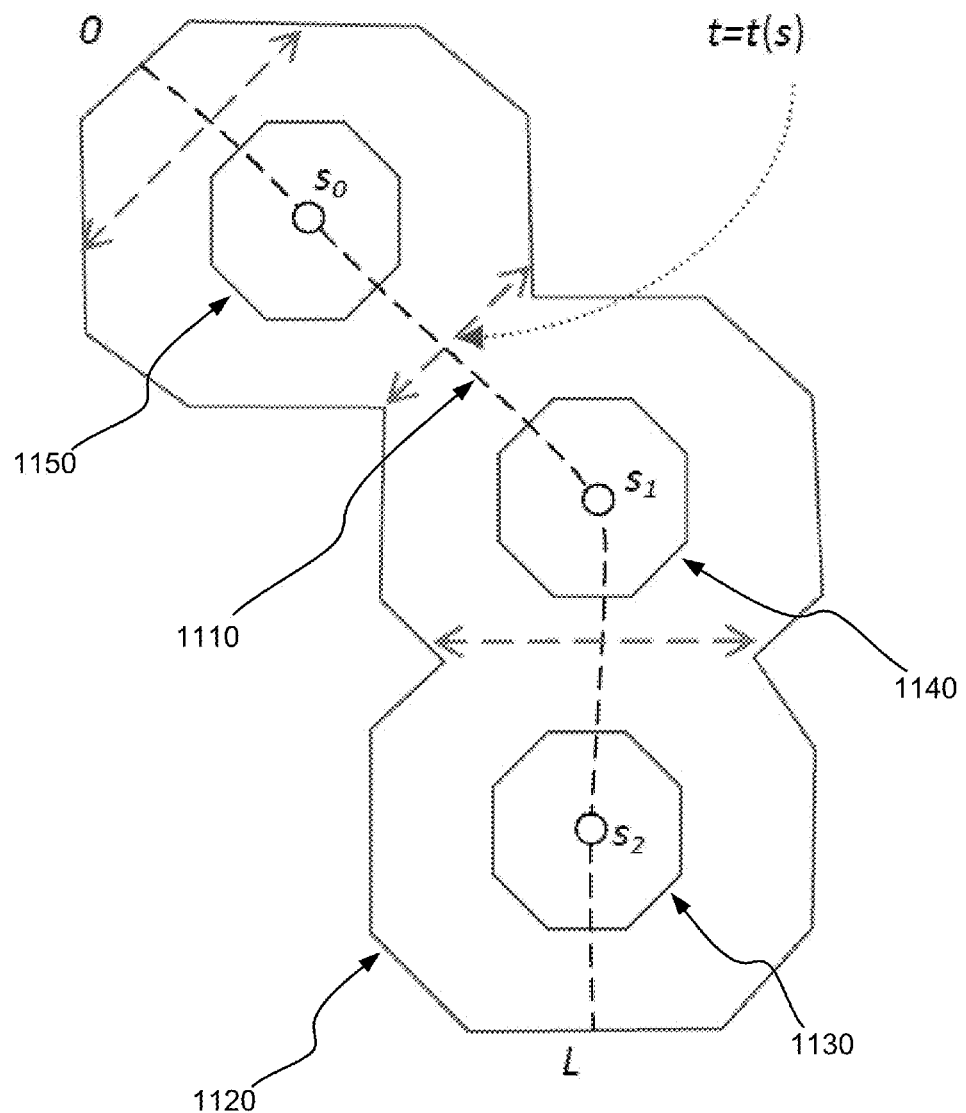
FIG. 11 illustrates an example of a backbone structure of a guiding pattern for a group of three via-type features.
Figure 12:
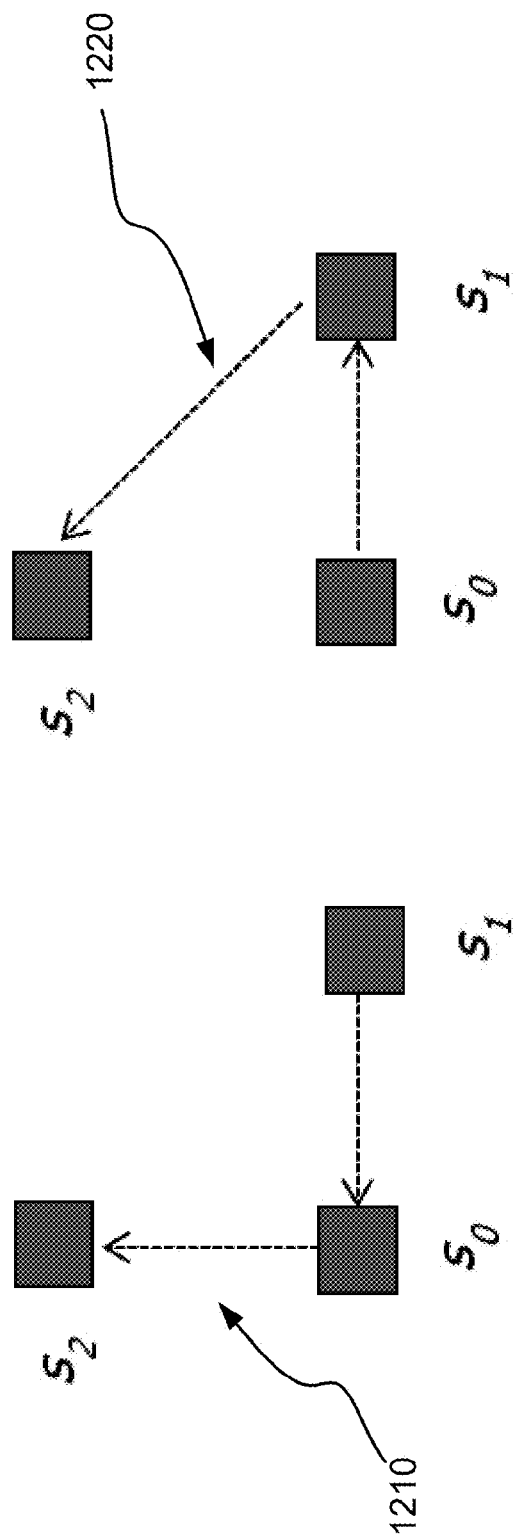
FIG. 12 illustrates an example of selecting a backbone structure from possible candidates.

Next, in operation 830, the backbone structure determining unit 720 may determine a backbone structure for the guiding pattern. The backbone structure is a line structure that runs through centers of the via-type features. FIG. 11 illustrates an example of a backbone structure 1110 of a guiding pattern 1120 for a group of three via-type features 1130, 1140 and 1150. For some via-type feature groups, there are more than one possible paths running through centers of the via-type features. FIG. 12 illustrates such an example. The figure shows two paths, 1210 and 1220, as possible candidates for the backbone structure. To deal with multiple candidates, some embodiments of the invention may further define the backbone structure as being the one that has the minimum length among all possible line structures. In the case of FIG. 12, the path 1210 may be selected as the backbone structure.

The guiding pattern may be mapped with back-bone coordinates as shown in FIG. 11:

$$s=\{s_0, s_1, \ldots, s_{N-1}\} \quad (4)$$

$$t=t(s) \quad (5)$$

where t represents the thickness of the guiding pattern that is measured in the direction perpendicular to s-axis. This may facilitate the next operation.

Next, in operation 840, the simulation unit 730 computes simulated locations of the two or more via-type features based on the backbone structure and a self-assembly model. One self-assembly model that can be employed by various embodiments of the invention is based on elastic potential energy (Hooke's law). Using the back-bone coordinates, the potential energy of the via-type feature group may be expressed as:

$$P(s) = \frac{k}{2}\sum_{i=1}^{N-1}(s_i - s_{i-1} - q)^2 + \frac{k}{2}\left(s_0 - \frac{q}{2}\right)^2 + \frac{k}{2}\left(L - s_{N-1} - \frac{q}{2}\right)^2 - \frac{1-k}{2}\sum_{i=0}^{N-1}t(s_i)^2$$

where the first three terms represent the internal energy and the last term accounts for the effect of the walls of the guiding pattern.

In a stationary state, P(s) reaches a minimum value. Minimization of Eq. (6) may be conducted by tweaking positions of $s_i$:

$$\partial P/\partial s_i = k(2s_i - s_{i+1} - s_{i-1}) - (1-k)t(s_i)t'(s_i) \quad (7)$$

where t'(s) is derivative of t(s) by s. Using Eq. (7), the simulated locations of the two or more via-type features can be derived. It should be appreciated by a person of ordinary skill of art that other minimization techniques may be employed.

Next, in operation 850, the comparison unit 740 compares the simulated locations with the targeted locations. If the simulated locations do not match the targeted locations based on a predetermined criterion, the feature location adjusting unit 750, in operation 860, adjusts the simulated locations to derive modified locations. Using the modified locations, the operations 820-860 may be repeated until the simulated locations match the targeted location based on a predetermined criterion or for a predetermined number of times. The obtained guiding pattern may then be outputted by the guiding pattern generation tool 700 to the database 785.

CONCLUSION

Having illustrated and described the principles of the disclosed technology, it will be apparent to those skilled in the art that the disclosed embodiments can be modified in arrangement and detail without departing from such principles. In view of the many possible embodiments to which the principles of the disclosed technologies can be applied, it should be recognized that the illustrated embodiments are only preferred examples of the technologies and should not be taken as limiting the scope of the invention. Rather, the scope of the invention is defined by the following claims and their equivalents. We therefore claim as our invention all that comes within the scope and spirit of these claims.

What is claimed is:

1. One or more processor-readable storage device storing computer-executable instructions for causing one or more processors to perform a method, the method comprising:

receiving information of a via-type feature group, the via-type feature group comprising two or more via-type features in a layout design, the information comprising targeted locations of the two or more via-type features;

constructing a guiding pattern for the via-type feature group based on the targeted locations of the two or more via-type features;

determining a backbone structure for the guiding pattern;

computing simulated locations of the two or more via-type features based on the backbone structure and a self-assembly model; and comparing the simulated locations with the targeted locations.

2. The one or more processor-readable storage device recited in claim 1, wherein the method further comprises:
   A: adjusting the simulated locations to derive modified locations if the simulated locations do not match the targeted locations based on a predetermined criterion;
   B: constructing a new guiding pattern for the via-type feature group based on the modified locations and the shapes of the two or more via-type features and the block copolymer area ratio information;
   C: determining a new backbone structure for the new guiding pattern;
   D: computing new simulated locations of the two or more via-type features based on the new backbone structure and the self-assembly model; and
   E: comparing the new simulated locations with the targeted locations.

3. The one or more processor-readable storage device recited in claim 2, wherein the method further comprises:
   repeating A, B, C, D and E until the new simulated locations match the targeted location based on a predetermined criterion or for a predetermined number of times.

4. The one or more processor-readable storage device recited in claim 1, wherein the two or more via-type features are grouped together based on at least distances between neighboring via-type features of the two or more via-type features.

5. The one or more processor-readable storage device recited in claim 1, wherein the via-type feature group is DSA(Directed-Self-Assembly)-compliant.

6. The one or more processor-readable storage device recited in claim 5, wherein the DSA(Directed-Self-Assembly)-compliant determination is based on distorted areas, a distorted area being an area not covered or covered twice by DSA shells of two neighboring via-type features.

7. The one or more processor-readable storage device recited in claim 1, wherein the constructing is further based on area ratio information of a di-block copolymer.

8. The one or more processor-readable storage device recited in claim 1, wherein the self-assembly model is based on elastic potential energy.

9. The one or more processor-readable storage device recited in claim 1, wherein the determining comprises determining back-bone coordinates for the guiding pattern.

10. A method, executed by at least one processor of a computer, comprising:
   receiving information of a via-type feature group, the via-type feature group comprising two or more via-type features in a layout design, the information comprising targeted locations of the two or more via-type features;
   constructing a guiding pattern for the via-type feature group based on the targeted locations of the two or more via-type features;
   determining a backbone structure for the guiding pattern;
   computing simulated locations of the two or more via-type features based on the backbone structure and a self-assembly model; and
   comparing the simulated locations with the targeted locations.

11. The method recited in claim 10, further comprising:
   A: adjusting the simulated locations to derive modified locations if the simulated locations do not match the targeted locations based on a predetermined criterion;
   B: constructing a new guiding pattern for the via-type feature group based on the modified locations and the shapes of the two or more via-type features and the block copolymer area ratio information;
   C: determining a new backbone structure for the new guiding pattern;
   D: computing new simulated locations of the two or more via-type features based on the new backbone structure and the self-assembly model; and
   E: comparing the new simulated locations with the targeted locations.

12. The method recited in claim 11, further comprising:
   repeating A, B, C, D and E until the new simulated locations match the targeted location based on a predetermined criterion or for a predetermined number of times.

13. The method recited in claim 10, wherein the two or more via-type features are grouped together based on at least distances between neighboring via-type features of the two or more via-type features.

14. The method recited in claim 10, wherein the via-type feature group is DSA(Directed-Self-Assembly)-compliant.

15. The method recited in claim 14, wherein the DSA(Directed-Self-Assembly)-compliant determination is based on distorted areas, a distorted area being an area not covered or covered twice by DSA shells of two neighboring via-type features.

16. The method recited in claim 10, wherein the constructing is further based on area ratio information of a di-block copolymer.

17. The method recited in claim 10, wherein the self-assembly model is based on elastic potential energy.

18. The method recited in claim 10, wherein the determining comprises determining back-bone coordinates for the guiding pattern.

19. A system comprising:
   one or more processors, the one or more processors programmed to perform a method, the method comprising:
   receiving information of a via-type feature group, the via-type feature group comprising two or more via-type features in a layout design, the information comprising targeted locations of the two or more via-type features;
   constructing a guiding pattern for the via-type feature group based on the targeted locations of the two or more via-type features;
   determining a backbone structure for the guiding pattern;
   computing simulated locations of the two or more via-type features based on the backbone structure and a self-assembly model; and
   comparing the simulated locations with the targeted locations.

20. The system recited in claim 19, wherein the method further comprises:
   A: adjusting the simulated locations to derive modified locations if the simulated locations do not match the targeted locations based on a predetermined criterion;
   B: constructing a new guiding pattern for the via-type feature group based on the modified locations and the shapes of the two or more via-type features and the block copolymer area ratio information;

C: determining a new backbone structure for the new guiding pattern;

D: computing new simulated locations of the two or more via-type features based on the new backbone structure and the self-assembly model; and E: comparing the new simulated locations with the targeted locations.

* * * * *